(12) United States Patent
Li (10) Patent No.: US 11,139,321 B2
(45) Date of Patent: Oct. 5, 2021

(54) DRIVE BACKPLANE, DISPLAY PANEL, ELECTRONIC APPARATUS, AND METHOD FOR PREPARING DRIVE BACKPLANE

(71) Applicant: BOE TECHNOLOGY GROUP CO., LTD., Beijing (CN)

(72) Inventor: Haixu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/651,400

(22) PCT Filed: Sep. 17, 2019

(86) PCT No.: PCT/CN2019/106183
§ 371 (c)(1),
(2) Date: Mar. 27, 2020

(87) PCT Pub. No.: WO2020/057501
PCT Pub. Date: Mar. 26, 2020

(65) Prior Publication Data
US 2020/0286930 A1    Sep. 10, 2020

(30) Foreign Application Priority Data

Sep. 21, 2018   (CN) .......................... 201811110064.1

(51) Int. Cl.
*H01L 27/14*     (2006.01)
*H01L 27/12*     (2006.01)
(Continued)

(52) U.S. Cl.
CPC ...... *H01L 27/1248* (2013.01); *H01L 25/0753* (2013.01); *H01L 27/124* (2013.01);
(Continued)

(58) Field of Classification Search
CPC ............. H01L 27/1248; H01L 27/1255; H01L 27/1259; H01L 27/124; H01L 25/0753; H01L 33/62
(Continued)

(56) References Cited

U.S. PATENT DOCUMENTS

| 10,330,997 B2 | 6/2019 | Cao et al. |
| 10,367,046 B2 | 7/2019 | Lee et al. |

(Continued)

FOREIGN PATENT DOCUMENTS

| CN | 203456466 U | 2/2014 |
| CN | 105676547 A | 6/2016 |

(Continued)

OTHER PUBLICATIONS

First Office Action, including Search Report, for Chinese Patent Application No. 201811110064.1, dated Sep. 27, 2019, 28 pages.

*Primary Examiner* — Tan N Tran
(74) *Attorney, Agent, or Firm* — Westman, Champlin & Koehler, P.A.

(57) ABSTRACT

A drive backplane, a display panel, an electronic apparatus, and a method for preparing a drive backplane are provided in embodiments of the disclosure, all relating to the technical field of display technology, the drive backplane including: a base substrate; a driving device layer on the base substrate, comprising an electrode layer; a planarization layer, on a surface of the driving device layer facing away from the base substrate, and the planarization layer being provided with at least one projection portion and at least one base portion adjacent to the at least one projection portion both on a surface of the planarization layer facing away from the driving device layer, each projection portion having a greater thickness than that of each base portion; a conductive layer, on respective surface of each projection portion facing away from the driving device layer, the conductive layer (Continued)

being connected with the electrode layer of the driving device layer; a spacer layer, on a surface of the conductive layer facing away from the planarization layer; and a binding layer, covering both a surface of the spacer layer facing away from the conductive layer and the surface of the conductive layer facing away from the planarization layer, the binding layer being where a light-emitting device is to be provided.

20 Claims, 6 Drawing Sheets

(51) Int. Cl.
*H01L 25/075* (2006.01)
*H01L 33/62* (2010.01)

(52) U.S. Cl.
CPC ...... *H01L 27/1255* (2013.01); *H01L 27/1259* (2013.01); *H01L 33/62* (2013.01); *H01L 2933/0066* (2013.01)

(58) Field of Classification Search
USPC .............................. 257/43, 59, 72
See application file for complete search history.

(56) References Cited

U.S. PATENT DOCUMENTS

| | | |
|---|---|---|
| 10,423,039 B2 | 9/2019 | Cao et al. |
| 10,747,080 B2 | 8/2020 | Li et al. |
| 2001/0025988 A1 | 10/2001 | Lee |
| 2012/0097952 A1 | 4/2012 | Kang et al. |
| 2016/0231616 A1 | 8/2016 | Kanda et al. |
| 2017/0133413 A1* | 5/2017 | Park ...................... G02F 1/1368 |
| 2018/0122882 A1 | 5/2018 | Lee et al. |
| 2018/0231817 A1 | 8/2018 | Li et al. |
| 2019/0079359 A1 | 3/2019 | Cao et al. |
| 2019/0250474 A1 | 8/2019 | Cao et al. |
| 2020/0286930 A1 | 9/2020 | Li |

FOREIGN PATENT DOCUMENTS

| | | |
|---|---|---|
| CN | 106992191 A | 7/2017 |
| CN | 107039352 A | 8/2017 |
| CN | 107403809 A | 11/2017 |
| CN | 107490914 A | 12/2017 |
| CN | 107731853 A | 2/2018 |
| CN | 108122944 A | 6/2018 |
| CN | 108598114 A | 9/2018 |
| CN | 109256052 A | 1/2019 |
| CN | 109994533 A | 7/2019 |
| JP | H10133012 A | 5/1998 |

\* cited by examiner

DRIVE BACKPLANE, DISPLAY PANEL, ELECTRONIC APPARATUS, AND METHOD FOR PREPARING DRIVE BACKPLANE

CROSS-REFERENCE TO RELEVANT INVENTION

This application is a Section 371 National Stage Application of International Application No. PCT/CN2019/106183, filed on Sep. 17, 2019, entitled "DRIVE BACKPLANE, ELECTRONIC APPARATUS, DISPLAY PANEL, AND METHOD FOR PREPARING DRIVE BACKPLANE", which has not yet published, and claims priority to Chinese Patent Application Invention No. 201811110064.1 filed on Sep. 21, 2018, in the China National Intellectual Property Administration, the contents of which are incorporated herein by reference in their entireties.

BACKGROUND OF THE DISCLOSURE

Field of the Disclosure

Embodiments of the present disclosure generally relate to the technical field of display technology, and in particular, to a drive backplane, a display panel, an electronic apparatus, and a method for preparing a drive backplane.

Description of the Relevant Art

With a development of display technology, requirements on display panels become higher. At present, micro LED display technology, namely, LED miniaturization and matrixing technology, is going to become an increasing concern. A relevant micro LED display panel generally comprises: a driving substrate; and a light-emitting device layer on the driving substrate, the light-emitting device layer comprising light emitting diodes (LED) which are arranged in an array and are driven by the driving substrate to emit light individually, so as to display images on the relevant micro LED display panel. However, it is difficult to install LED on the relevant driving substrate, and a gas storage capacity of a planarization layer in the relevant driving substrate is relatively large, and accordingly, a gas displacement (i.e., the amount of gas exhaust of the planarization layer is also relatively large, which fact will reduce a reliability of the product.

It should be noted, that the information disclosed in above background of the disclosure is merely used to enhance/facilitate understanding of the background of the disclosure, such that it may comprise information failing to constitute relevant art as known to those skilled in the art.

SUMMARY OF THE DISCLOSURE

The embodiments of the present disclosure have been made to overcome or alleviate at least one aspect of the above mentioned disadvantages and/or shortcomings in the prior art, by providing a drive backplane, a display panel, an electronic apparatus, and a method for preparing a drive backplane, facilitating installation of a light-emitting device and reduction in gas displacement of a planarization layer.

Following technical solutions are adopted in exemplary embodiments of the disclosure.

According to one aspect of embodiments of the disclosure, there is provided a drive backplane, comprising:
a base substrate;
a driving device layer on the base substrate, comprising an electrode layer;
a planarization layer, on a surface of the driving device layer facing away from the base substrate, and the planarization layer being provided with at least one projection portion and at least one base portion adjacent to the at least one projection portion both on a surface of the planarization layer facing away from the driving device layer, each projection portion having a greater thickness than that of each base portion in a direction perpendicular to a plane in which the base substrate is located;
a conductive layer, on respective surface of each projection portion facing away from the driving device layer, the conductive layer being connected with the electrode layer of the driving device layer;
a spacer layer, on a surface of the conductive layer facing away from the planarization layer, the spacer layer at least partially covering the surface of the conductive layer facing away from the planarization layer; and a binding layer, at least partially covering both a surface of the spacer layer facing away from the conductive layer and a portion of the surface of the conductive layer facing away from the planarization layer which is not covered by the spacer layer, the binding layer being where a light-emitting device is to be provided.

In exemplary embodiments of the disclosure, the drive backplane further comprises a black matrix provided at the at least one base portion, with the at least one projection portion being not covered by the black matrix.

In exemplary embodiments of the disclosure, the spacer layer at least partially covers the surface of the conductive layer facing away from the planarization layer, and extends to a groove formed between adjacent ones of the at least one projection portion of the planarization layer.

In exemplary embodiments of the disclosure, a height of the spacer layer protruding above the black matrix is not less than 1 µm.

In exemplary embodiments of the disclosure, the drive backplane further comprises an insulation layer on the surface of the at least one base portion facing away from the base substrate, the insulation layer extending to the conductive layer and covering a portion of a region of the conductive layer, with the black matrix being provided on a surface of the insulation layer facing away from the planarization layer.

In exemplary embodiments of the disclosure, the binding layer covers a region of the insulation layer overlapping with the conductive layer.

In exemplary embodiments of the disclosure, a distance between the conductive layer and bottoms of the at least one base portion is the same as a thickness of the black matrix.

In exemplary embodiments of the disclosure, the driving device layer further comprises:
a buffer layer, on the base substrate;
an active layer, on a surface of the buffer layer facing away from the base substrate;
a first gate insulation layer covering both the active layer and a region of the buffer layer which is not covered by the active layer;
a gate electrode, on a surface of the first gate insulation layer facing away from the active layer;
a second gate insulation layer covering both the gate electrode and a region of the first gate insulation layer which is not covered by the gate electrode; and
an interlayer medium layer, on a surface of the second gate insulation layer facing away from the gate electrode;

wherein the electrode layer is provided on a surface of the interlayer medium layer facing away from the second gate insulation layer, and comprises a source electrode and a drain electrode, both the source electrode and the drain electrode are respectively connected with the active layer through respective first through-holes, and the respective first through-holes extend through the interlayer medium layer, the second gate insulation layer and the first gate insulation layer and in turn reach a surface of the active layer facing away from the base substrate.

In exemplary embodiments of the disclosure, the driving device layer comprises a capacitive electrode on the surface of the second gate insulation layer facing away from the gate electrode, and an orthogonal projection of the capacitive electrode on the first gate insulation layer coincides with an orthogonal projection of the gate electrode on the first gate insulation layer, and the interlayer medium layer covers both the capacitive electrode and a region of the second gate insulation layer which is not covered by the capacitive electrode, and the capacitive electrode and the gate electrode collectively form a storage capacitance.

In exemplary embodiments of the disclosure, the at least one projection portion comprises a plurality of projection portions, and the at least one base portion comprises a plurality of base portions;

the conductive layer comprises a plurality of groups of electrodes provided in one-to-one correspondence on respective surfaces of the plurality of projection portions facing away from the driving device layer, and each group of the plurality of groups of electrodes comprises a first electrode and a second electrode, and the first electrode is connected with a drain electrode through a second through-hole;

the spacer layer comprises a plurality of spacer portions provided in one-to-one correspondence on respective surfaces of the plurality of groups of electrodes facing away from the planarization layer, and each of the plurality of spacer portions spaces respective first electrode apart from respective second electrode;

the binding layer comprises a plurality of bonding pads provided in one-to-one correspondence on respective surfaces of the plurality of spacer portions facing away from the planarization layer, and each of the plurality of bonding pads is connected with respective first electrode and respective second electrode; and the black matrix comprises a plurality of light-shielding units provided in one-to-one correspondence in the plurality of base portions.

In exemplary embodiments of the disclosure, an orthogonal projection of each group of electrodes on the driving device layer and an orthogonal projection of a respective one of the plurality of projection portions on the driving device layer at least partially overlap with each other; or an orthogonal projection of each of the plurality of spacer portions on the driving device layer and an orthogonal projection of a respective group of the plurality of groups of electrodes on the driving device layer at least partially overlap with each other; or an orthogonal projection of each of the plurality of light-shielding units on the driving device layer and an orthogonal projection of a respective one of the base portions on the driving device layer at least partially overlap with each other.

According to another aspect of the exemplary embodiment of the present disclosure, there is provided a method for preparing a driving backplane, comprising:

forming a driving device layer on a base substrate;

forming a planarization layer on a surface of the driving device layer facing away from the base substrate;

forming a conductive layer on a surface of the planarization layer facing away from the driving device layer, the conductive layer being connected with an electrode layer in the driving device layer;

forming a pattern of the conductive layer by etching the conductive layer;

forming at least one projection portion and at least one base portion by etching a region of the planarization layer not covered by the conductive layer, the conductive layer being located on respective surface of each projection portion facing away from the driving device layer;

forming a spacer layer on a surface of the conductive layer facing away from the planarization layer, the spacer layer being formed to extend into a portion of a thickness of the planarization layer; and forming a binding layer on a surface of the spacer layer facing away from the conductive layer, the binding layer being connected with the conductive layer and being where a light-emitting device is to be provided.

In exemplary embodiments of the disclosure, after "forming a binding layer on a surface of the spacer layer facing away from the conductive layer", the method further comprises:

forming a black matrix in the at least one base portion, the at least one projection portion protruding above the black matrix.

In exemplary embodiments of the disclosure, "forming a driving device layer on a base substrate" comprises:

forming a buffer layer on the base substrate;

forming an active layer on a surface of the buffer layer facing away from the base substrate;

forming a first gate insulation layer covering both the active layer and a region of the buffer layer which is not covered by the active layer;

forming a gate electrode on a surface of the first gate insulation layer facing away from the buffer layer, an orthogonal projection of the gate electrode on the buffer layer being covered by the active layer;

forming a second gate insulation layer covering both the gate electrode and a region of the first gate insulation layer which is not covered by the gate electrode;

forming an interlayer medium layer on a surface of the second gate insulation layer facing away from the gate electrode;

forming first through-holes penetrating through the first gate insulation layer, the second gate insulation layer and the interlayer medium layer to reach an upper surface of the active layer facing away from the base substrate and to expose the active layer; and forming a source electrode and a drain electrode on a surface of the interlayer medium layer facing away from the second gate insulation layer, both the source electrode and the drain electrode being connected with the active layer through respective ones of the first through-holes.

In exemplary embodiments of the disclosure, after "forming a gate electrode on a surface of the first gate insulation layer facing away from the buffer layer", and before "forming a second gate insulation layer covering both the gate electrode and a region of the first gate insulation layer which is not covered by the gate electrode", in the method, "forming a driving device layer on a base substrate" further comprises:

forming a capacitive electrode on the surface of the second gate insulation layer facing away from the gate electrode, with an orthogonal projection of the capacitive electrode on the first gate insulation layer coinciding with an orthogonal projection of the gate electrode on the first gate insulation layer, and the capacitive electrode and the gate electrode in turn collectively forming a storage capacitance.

In exemplary embodiments of the disclosure, "forming a pattern of the conductive layer by etching the conductive layer" comprises:

forming a plurality of groups of electrodes by etching the conductive layer, each group of the plurality of groups of electrodes comprising a first electrode and a second electrode, the first electrode and the second electrode being spaced apart from each other by a groove which is concave and penetrates through the conductive layer and in turn extends into a portion of a thickness of the planarization layer, and the first electrode being connected with the drain electrode through a second through hole, the plurality of groups of electrodes covering the planarization layer while the groove in the planarization layer being exposed from a region outside the plurality of groups of electrodes.

In exemplary embodiments of the disclosure, "forming a binding layer on a surface of the spacer layer facing away from the conductive layer, the binding layer being connected with the conductive layer and being where a light-emitting device is to be provided" comprises:

forming a binding layer on a surface of the spacer layer facing away from the conductive layer by lithography and printing, the binding layer extending to a region of the conductive layer which is not covered by the spacer layer and in turn to be connected with the conductive layer.

In exemplary embodiments of the disclosure, the method further comprises:

forming an insulation layer in the at least one base portion, the insulation layer extending towards the conductive layer and covering a portion of a region of the conductive layer.

According to still another aspect of the exemplary embodiment of the present disclosure, there is provided a display panel, comprising:

the drive backplane as above; and
the light-emitting device provided on the binding layer.

According to yet another aspect of the exemplary embodiment of the present disclosure, there is provided an electronic apparatus, comprising the display panel as above.

BRIEF DESCRIPTION OF THE DRAWINGS

The drawings herein are incorporated into and form part of the specification, showing embodiments in accordance with the disclosure, and are used with the specification to explain principles of the disclosure. Obviously, the drawings in the following description are merely illustrative of some embodiments of the present disclosure. For those skilled in the art, other drawings may be obtained according to these drawings without any paying any creative work.

DETAILED DESCRIPTION OF PREFERRED EMBODIMENTS OF THE INVENTION

Exemplary embodiments will now be described more comprehensively with reference to the accompanying drawings. However, the exemplary embodiments may be implemented in a variety of forms, and should not be understood as being limited to the embodiments described herein; on the contrary, the disclosure will become more comprehensive and complete by providing these embodiments, and a technical concept of the exemplary embodiments may be conveyed more comprehensively to those skilled in the art. Same reference numerals in the drawings represent same or similar structures, respectively, with their detailed descriptions being omitted.

Although relativity terms, such as "up/upper" and "down/lower", are used in the specification to describe relative relationship between one component and another component as illustrated, these terms are merely used for convenience in the specification, e.g., according to directions in the example as illustrated in the drawings. It is understood that if a device as illustrated is turned upside down, then the component labeled by "up/upper" will become the component labeled by "down/lower". In a condition that one structure is "on" another structure, it may mean that said structure is integrally formed on the another structure, or it may alternatively mean that said structure is "directly" provided on the another structure, or otherwise it may mean that said structure is "indirectly" provided on the another structure via other one structure.

Terms "a", "one", "the", "said" are used to indicate an existence of one or more elements, components and the like; the terms "comprise" and "have" are used to indicate an open expression having a meaning of "inclusive" and refer to an existence of other elements, components and the like in addition to the elements, components and the like as listed; and terms "first", "second" and so on are merely used as marks, respectively, rather than being respective limits on the number of objects referred to.

The shape and size of each component in the drawings do not reflect the true proportion of each film layer and component of the display panel of the embodiment of the present disclosure, and the purpose is merely to illustrate the content of the embodiment of the present disclosure.

Respective dimension and shape of each component in the drawings are merely intended to exemplarily illustrate the contents of the disclosure, rather than to demonstrate the practical dimension or proportion of components of the drive backplane, the display panel, and the electronic apparatus in the embodiment of the present disclosure.

Figure 1:
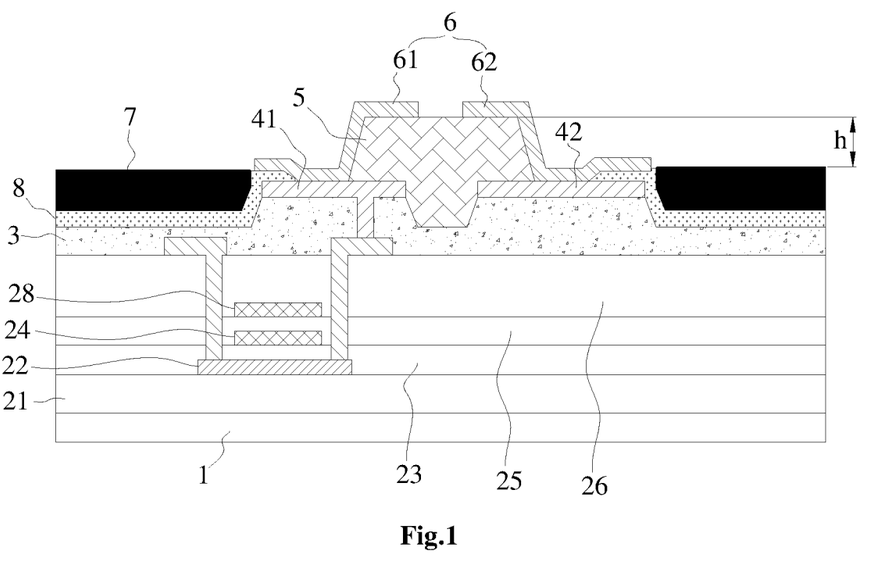
FIG. 1 is a structural schematic view of a drive backplane according to embodiments of the present disclosure.

According to a general inventive technical concept of embodiments of the disclosure, a driving backplane applying to a display panel is provided in embodiments of the disclosure, and the display panel is for example a micro LED display panel. As illustrated in FIG. 1 and FIG. 3 to FIG. 8, the drive backplane comprises, for example, a base substrate 1, a driving device layer 2, a planarization layer 3, a conductive layer 4, a spacer layer 5, a binding layer 6; and, for example, the drive backplane further comprises black matrix 7, specifically:

The driving device layer 2 is for example provided on the base substrate 1, and comprises an electrode layer.

The planarization layer 3 is for example provided on a surface of the driving device layer 2 facing away from the base substrate 1, and the planarization layer 3 is provided with at least one projection portion 301 and at least one base portion 302 adjacent to the at least one projection portion 301, both on a surface of the planarization layer 3 facing away from the driving device layer 2, and each projection portion has a greater thickness than that of each base portion in a direction perpendicular to a plane in which the base substrate is located.

The conductive layer 4 is provided on respective surface(s) of the at least one projection portion 301 facing away from the driving device layer 2, and is connected with the electrode layer of the driving device layer 2.

The spacer layer 5 is provided on a surface of the conductive layer 4 facing away from the planarization layer 3, the spacer layer at least partially covers the surface of the conductive layer 4 facing away from the planarization layer 3; and the spacer layer 5 for example at least partially extends into the planarization layer, as illustrated (e.g., extending into a groove which is concave and formed between two adjacent projection portions 301).

The binding layer 6 at least partially covers both a surface of the spacer layer 5 facing away from the conductive layer 4 and a portion of the surface of the conductive layer 4 facing away from the planarization layer 3 which is not covered by the spacer layer 5; and the binding layer is used for providing a light-emitting device or light-emitting devices thereon.

And by way of example, the black matrix 7 is provided at the base 302, and the at least one projection portion 301 is not covered/shielded by the black matrix 7, such that the at least one projection portion 301 is protrude to be exposed from the black matrix.

As to the display panel according to embodiments of the present disclosure, for example, since the planarization layer 3 has the at least one projection portion 301 and the at least one portion 302, the black matrix 7 is located above the at least one base portion 302, the binding layer 6 is located above the at least one projection portion 301, and the binding layer 6 is supported by both the spacer layer 5 and the conductive layer 4, thereby increasing a height of the binding layer 6, facilitating a connection between the light-emitting device(s) and the binding layer 6; and moreover, for example, by providing the at least one base portion 302, a vertical dimension of the at least one projection portion 301 of the planarization layer 3 (on which the binding layer 6 to be connected with the conductive layer 4 is provided) higher than (i.e., protruding above) the at least one base portion 302 is thinned, thereby reducing a local thickness of the planarization layer 3 as required, and in turn reducing the gas storage capacity therein, facilitating reduction in gas displacement of the planarization layer and ensuring the product quality.

Various components of the display panel according to embodiments of the present disclosure will be described in detail as follows:

The base substrate 1 may for example be formed by glass or other transparent material(s), and its shape may for example be rectangular shape, round shape, etc., without being specifically limited herein.

Figure 3:
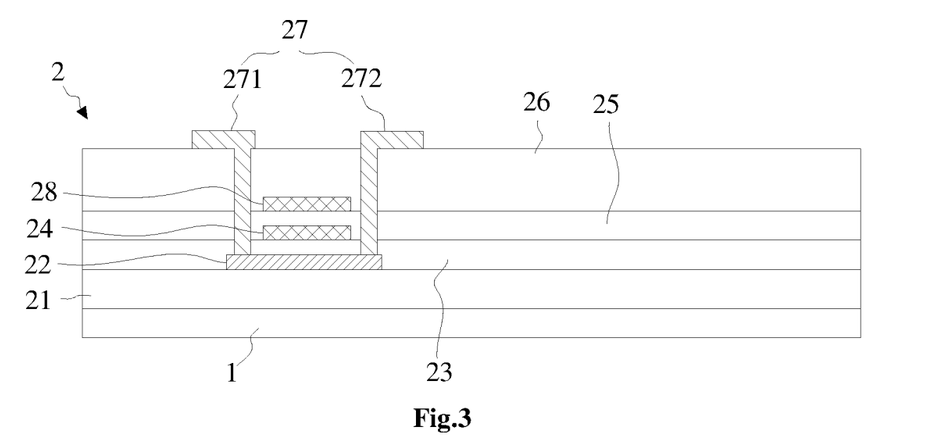
FIG. 3 is a structural schematic view after completing step S110 in FIG. 2.

As illustrated in FIG. 3, the driving device layer 2 is for example provided on the base substrate 1, and for example comprises a plurality of driving devices configured to drive the light-emitting device(s) provided on the driver backplane, respectively; and the plurality of driving devices are, for example, thin film transistors.

As illustrated in FIG. 3, for example, the driving device layer 2 comprises, for example, a buffer layer 21, an active layer 22, a first gate insulation layer 23, a gate electrode 24, a second gate insulation layer 25, an interlayer medium layer 26, and a source/drain electrode 27, specifically:

The buffer layer 21 is for example provided on the base substrate 1, and is formed by a material of silicon nitride or silicon oxide, or other material(s). The active layer 22 is for example provided on a surface of the buffer layer 21 facing away from the base substrate 1. For example, the first gate insulation layer 23 covers both the active layer 22 and a region of the buffer layer 21 which is not covered by the active layer 22, and is formed by a material of silicon oxide. For example, the gate electrode 24 is provided on a surface of the first gate insulation layer 23 facing away from the active layer 22, and more specifically, an orthogonal projection of the gate electrode 24 on the buffer layer is covered by the active layer 22; and the gate electrode 24 is for example formed by a metal material. The second gate insulation layer 25 for example covers both the gate electrode 24 and a region of first the gate insulation layer 23 which is not covered by the gate electrode 24, and is for example formed by the material of the first gate insulation layer 23. For example, the interlayer medium layer 26 is provided on a surface of the second gate insulation layer 25 facing away from the gate, and is for example formed by at least one of silicon oxide and silicon nitride; and of course, a material of the interlayer medium layer 26 may for example alternatively selected as other material(s). For example, the electrode layer is provided on a surface of the interlayer medium layer 26 facing away from the second gate insulation layer 25, and comprises a source/drain electrode 27 which specifically comprises both a source electrode 271 and a drain electrode 272 both being connected with the active layer 22 through respective first through-holes, respectively, and each first through-hole extends through the interlayer medium layer 26, the second gate insulation layer 25 and the first gate insulation layer 23 and in turn reach an upper surface of the active layer 22 facing away from the base substrate 1.

In addition, the driving device layer 2 as above for example comprises a capacitive electrode 28, which is for example also provided on the surface of the second gate insulation layer 25 facing away from the gate electrode 24, and more specifically, an orthogonal projection of the capacitive electrode 28 on the first gate insulation layer 23 coincides with an orthogonal projection of the gate electrode 24 on the first gate insulation layer 23; and the interlayer medium layer 26 for example covers both the capacitive electrode 28 and a region of the second gate insulation layer 25 which is not covered by the capacitive electrode 28.

For example, the capacitive electrode 28 and the gate electrode 24 collectively form a storage capacitance; in other words, the gate electrode not only 24 not only functions as a gate electrode of a respective thin film transistor, but also functions as an electrode of the storage capacitance.

Figure 7:
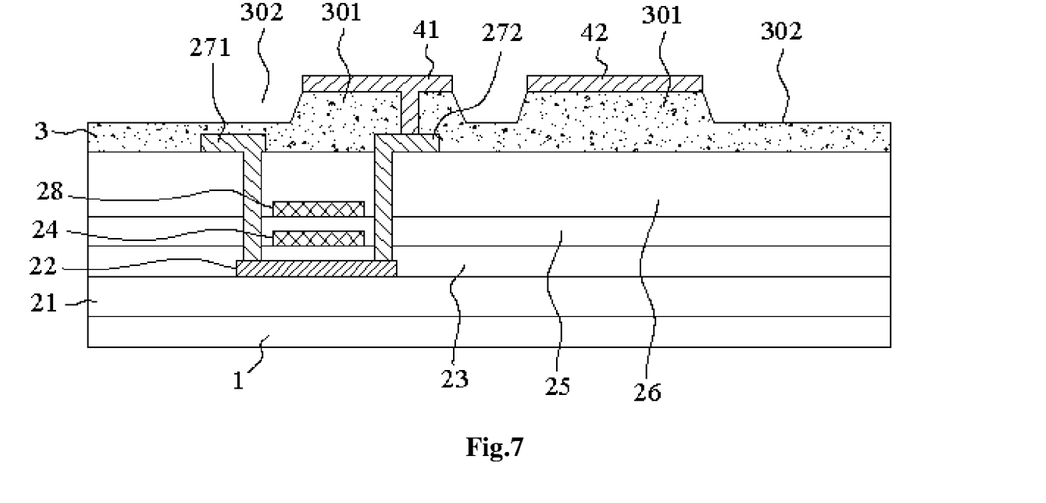
FIG. 7 is a structural schematic view after completing step S150 in FIG. 2.

As illustrated in FIG. 1 and FIG. 7, the planarization layer 3 is for example formed by an insulative material, and it is for example provided on the surface of the driving device layer 2 facing away from the base substrate 1, and said surface of the planarization layer 3 facing away from the driving device layer 2 is for example provided with at least one (e.g. a plurality of) projection portions 301 and at least one (e.g. a plurality of) base portions 302. For example, a specific setting of the planarization layer 3 as described above (i.e., the source/drain electrode is raised by provision of the at least one projection portion, facilitating increasing a distance between the conductive layer 4 and the source/drain electrode 27) may decrease a capacitance between the conductive layer 4 and the source/drain electrode 27 and in turn reduce a signal interference.

As illustrated in FIG. 1 and FIG. 7, the conductive layer 4 is for example formed by a material such as metal or other conductive material, and the conductive layer 4 is for example provided on the surface of the plurality of projection portions 301 facing away from the driving device layer 2 and is connected with the driving device layer 2. By way of example, specifically, the conductive layer 4 for example comprises a plurality of groups of electrodes which are provided in one-to-one correspondence on respective surfaces of the plurality of projection portions facing away from the driving device layer 2 (in other words, an orthogonal projection of each group of the plurality of groups of electrodes on the driving device layer 2 at least partially overlap with an orthogonal projection of a respective one of the plurality of projection portions 301 on the driving device layer 2), and each group of the plurality of groups of electrodes for example comprises a first electrode 41 and a second electrode 42 both located on the respective projection portion 301 (more specifically, being located on a surface of the respective projection portion 301 facing away from the base substrate 1), and the first electrode 41 is for example in turn connected with the drain electrode 272 through a second through-hole.

Figure 8:
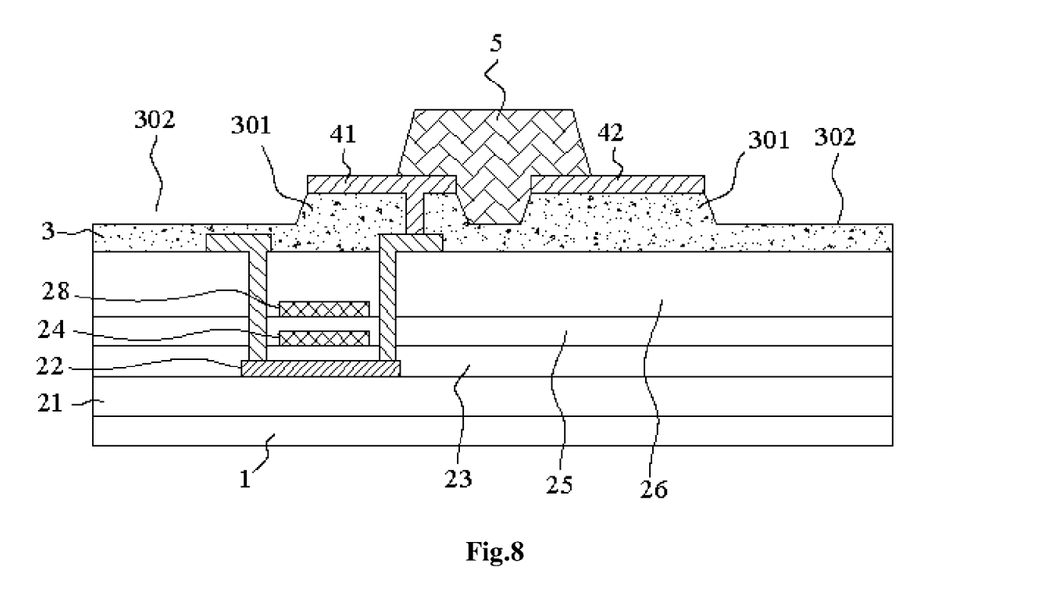
FIG. 8 is a structural schematic view after completing step S160 in FIG. 2.

As illustrated in FIG. 1, FIG. 7 and FIG. 8, the spacer layer 5 is for example formed by the same material as that of the planarization layer 3, and is for example provided on the surface of the conductive layer 4 facing away from the planarization layer 3, but fails to completely cover the plurality of groups of electrodes. And since the spacer layer 5 for example at least partially extends into the planarization layer, as illustrated (for example, extending into the groove which is concave and formed between two adjacent projection portions 301), then the spacer layer 5 for example spaces the first electrode 41 apart from the second electrode 42 in respective group of the plurality of electrodes. For example, the spacer layer 5 comprises a plurality of spacer portions provided in one-to-one correspondence on respective surfaces of the plurality of groups of electrodes facing away from the planarization layer 3 (in other words, an orthogonal projection of each of the plurality of spacer portions on the driving device layer 2 at least partially overlap with an orthogonal projection of a respective group of the plurality of groups of electrodes on the driving device layer 2); and each of the plurality of spacer portions spaces the first electrode 41 apart from the second electrode 42 in respective group of the plurality of electrodes, and for example covers a portion of the first electrode 41 and a portion of the second electrode 42 both of which are spaced apart from each other thereby.

As illustrated in FIG. 1, the binding layer 6 is for example formed by a conductive material such as metal and the like, and it for example covers the surface (comprising an inclined side surface and a flat upper surface) of the spacer layer 5 facing away from the conductive layer 4 and the surface of the conductive layer 4 facing away from the planarization layer 3 (which surface of the conductive layer 4 is exposed from the black matrix 7 and the insulation layer 8). Moreover, due to the existence of the spacer layer 5, for example, a region of the binding layer 6 covering the spacer layer 5 is raised and convex, facilitating providing the light-emitting device(s) on the binding layer 6.

By way of example, the binding layer 6 for example comprises a plurality of bonding pads for example provided in one-to-one correspondence on respective surfaces of the plurality of spacer portions facing away from the planarization layer 3 (for example, each of the plurality of bonding pads is provided on the aforementioned flat upper surface of a respective spacer portion of the spacer layer), and each of the plurality of bonding pads is connected with the first electrode 41 and the second electrode 42 of a respective group of the plurality of groups of electrodes. For any bonding pad, it for example extend from a surface of respective spacer portion facing away from the conductive layer 4 (specifically from its flat upper surface through its inclined side surface) to the first electrode 41 and the second electrode 42, so as to be connected with the first electrode 41 and the second electrode 42. Specifically, each bonding pad for example comprises a first bonding pad body 61 and a second bonding pad body 62 spaced apart from each other by an interval therebetween, the first bonding pad body 61 is for example connected with the first electrode 41, and the second bonding pad body 62 is, for example connected with the second electrode 42.

As illustrated in FIG. 1, the black matrix 7 is for example formed by a light-shielding material, and is for example provided at the base portions 302, and the plurality of projection portions 301 are not covered/shielded by the black matrix 7. For example, the black matrix 7 for example comprises a plurality of light-shielding units for example provided in one-to-one correspondence at the plurality of base portions 302 (more specifically, an orthogonal projection of each of the plurality of light-shielding units on the driving device layer 2 for example at least partially overlaps with an orthogonal projection of a respective one of the plurality of base portions 302 on the driving device layer 2), and the driving backplane is for example divided into a plurality of pixel regions by the plurality of light-shielding units, each pixel region has a bonding pad (for example, merely one bonding pad as illustrated), and each bonding pad is for example provided with (for example one or more) light-emitting devices thereon.

As illustrated in FIG. 1, a height h of the spacer layer 5 protruding above the black matrix 7 is not less than 1 μm, i.e., h≥1 μm, for example, h is 1.7 μm, etc. And a distance between the conductive layer 4 and bottoms of the plurality of base portions 302 (i.e., a distance between a lower surface of the conductive layer 4 facing towards the base substrate and an upper surface of the driving device layer 2 facing away from the base substrate) is for example 1 μm; of course, it may alternatively be larger or smaller. And a thickness of the black matrix 7 is for example 1 μm, or alternatively larger than or smaller than 1 μm. By way of example, the distance between the conductive layer 4 and bottoms of the plurality of base portions 302 is the same as the thickness of the black matrix, both for example being equal to 1 μm.

As illustrated in FIG. 1, the drive backplane of embodiments of the present disclosure for example also comprises an insulation layer 8, which is for example provided on the surface of the plurality of base portions 302 facing away from the base substrate and extends to the conductive layer 4. And the black matrix 7 is for example provided on a surface of the insulation layer 8 facing away from the planarization layer 3. A portion of the insulation layer 8 extending to the conductive layer 4 covers a portion of a region of the conductive layer 4, and the binding layer 6 covers a region of the insulation layer 8 corresponding to the conductive layer 4 (i.e., a region of the insulation layer 8 which overlaps with the conductive layer 4); in other words, a portion of the conductive layer 4 which is not covered by the insulation layer 8 (i.e., a portion of the conductive layer 4 which is exposed from the insulation layer 8) is for example covered by the binding layer 6, so as to facilitating connecting the binding layer 6 and the conductive layer 4.

Figure 2:
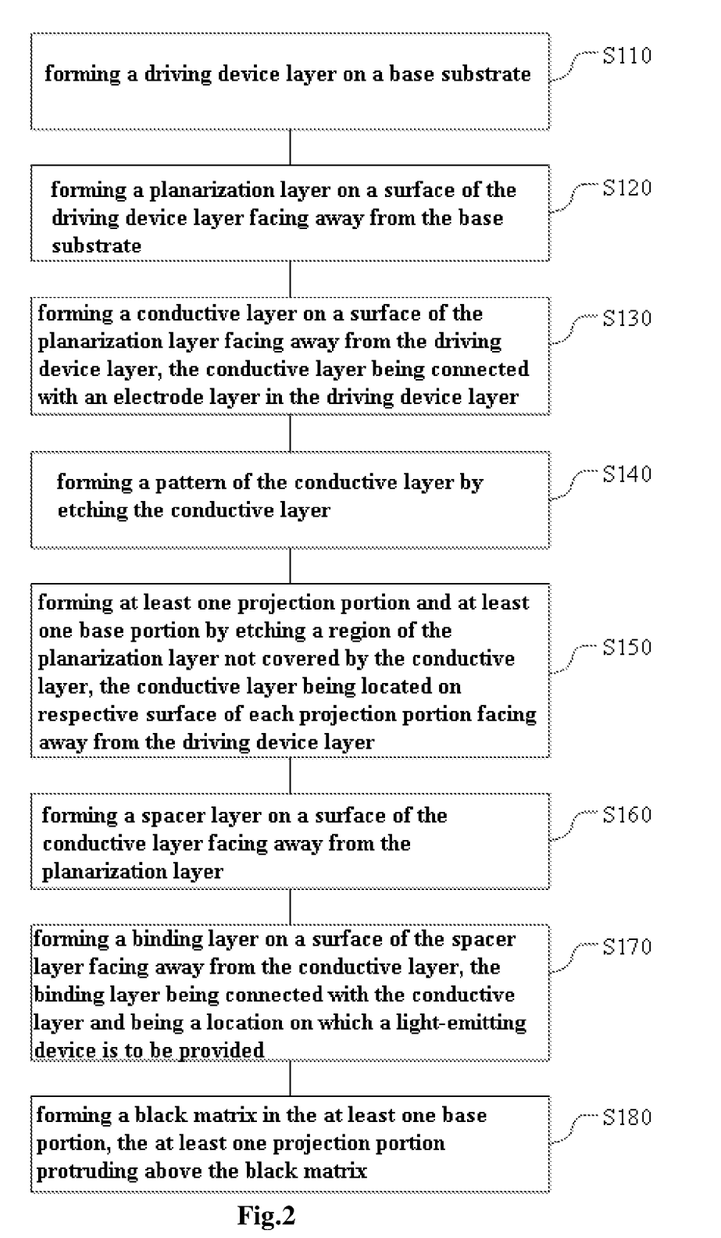
FIG. 2 is a flow chart of a method for manufacturing a drive backplane according to embodiments of the present disclosure.

In embodiments of the present disclosure, a method for preparing a driving backplane is provided, as illustrated in FIG. 2. The method for example comprises:

Step S110, forming a driving device layer on a base substrate;

Step S120, forming a planarization layer on a surface of the driving device layer facing away from the base substrate;

Step S130, forming a conductive layer on a surface of the planarization layer facing away from the driving device layer, the conductive layer being connected with an electrode layer in the driving device layer;

Step S140, forming a pattern of the conductive layer by etching the conductive layer;

Step S150, forming at least one projection portion and at least one base portion by etching a region of the planarization layer not covered by the conductive layer, the conductive layer being located on respective surface of each projection portion facing away from the driving device layer;

Step S160, forming a spacer layer on a surface of the conductive layer facing away from the planarization layer, the spacer layer being formed to extend into a portion of a thickness of the planarization layer (for example extending into a groove which is concave and is formed in the at least one projection portion of the planarization layer); and Step S170, forming a binding layer on a surface of the spacer layer facing away from the conductive layer, the binding layer being connected with the conductive layer and being a location on which a light-emitting device is to be provided.

Moreover, the method for example also comprises: Step S180, forming a black matrix in the at least one base portion, the at least one projection portion protruding above the black matrix.

Various steps of the method according to embodiments of the present disclosure are described in detail as follows:

In the step S110, a driving device layer is formed on a base substrate.

As illustrated in FIG. 3, the driving device layer 2 for example comprises: a buffer layer 21, an active layer 22, a first gate insulation layer 23, a gate electrode 24, a second gate insulation layer 25, an interlayer medium layer 26, and a source/drain electrode 27. For example, the step S110 comprises:

Step S1110, forming a buffer layer 21 on the base substrate 1;

Step S1120, forming an active layer 22 on a surface of the buffer layer 21 facing away from the base substrate 1;

Step S1130, forming a first gate insulation layer 23 covering both the active layer 22 and a region of the buffer layer 21 which is not covered by the active layer 22;

Step S1140, forming a gate electrode 24 on a surface of the first gate insulation layer 23 facing away from the buffer layer 21, more specifically, for example, an orthogonal projection of the gate electrode 24 on the buffer layer being covered by the active layer 22;

Step S1150, forming a second gate insulation layer 25 covering both the gate electrode 24 and a region of the first gate insulation layer 23 which is not covered by the gate electrode 24;

Step S1160, forming an interlayer medium layer 26 on a surface of the second gate insulation layer 25 facing away from the gate electrode 24;

Step S1170, forming first through-holes penetrating through the first gate insulation layer 23, the second gate insulation layer 25 and the interlayer medium layer 26 to reach an upper surface of the active layer 22 facing away from the base substrate 1 and to expose the active layer 22; and Step S1180, forming a source/drain electrode 27 on a surface of the interlayer medium layer 26 facing away from the second gate insulation layer 25, the source/drain electrode 27 being connected with the active layer 22 through respective ones of the first through-holes.

A detailed structure of the driving device layer 2 may refer to implementations of the above-mentioned drive backplane, which will not be described repeatedly here.

In addition, the step S110 also comprises: Step S1190, forming a capacitive electrode 28 on the surface of the second gate insulation layer 25 facing away from the gate electrode 24, with an orthogonal projection of the capacitive electrode 28 on the first gate insulation layer 23 coinciding with an orthogonal projection of the gate electrode 24 on the first gate insulation layer 23, such that the capacitive electrode 28 and the gate electrode 24 in turn collectively forming a storage capacitance. The step S1190 is for example carried out between the Step S1140 and the Step S1150, and the interlayer medium layer 26 for example covers both the capacitive electrode 28 and a region of the insulation layer 25 which is not covered by the capacitive electrode 28.

In the step S120, a planarization layer is formed on a surface of the driving device layer away from the base substrate.

Figure 4:
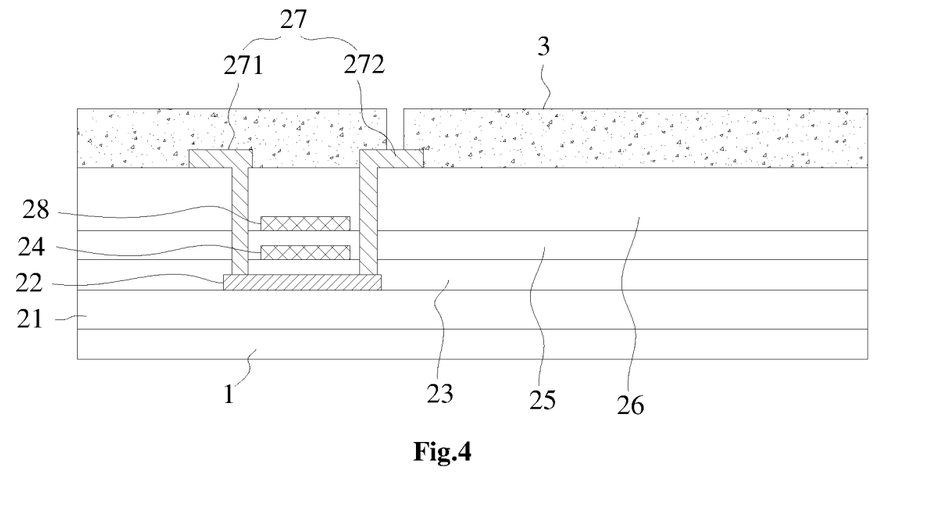
FIG. 4 is a structural schematic view after completing step S120 in FIG. 2.

As illustrated in FIG. 4, the planarization layer 3 may for example be formed by lithography or one or more other processes. The planarization layer 3 has a through-hole of the drain electrode 272. A surface of the planarization layer 3 facing away from the base substrate 1, which surface is formed in Step S120, is for example a plane.

In the Step S130, a conductive layer is formed on a surface of the planarization layer facing away from the driving device layer, and the conductive layer is connected with the driving device layer.

Figure 5:
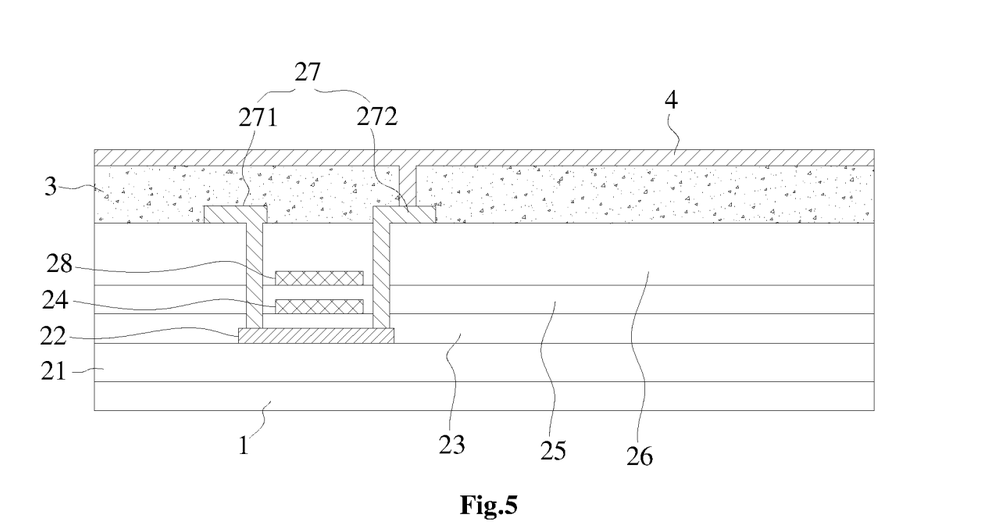
FIG. 5 is a structural schematic view after completing step S130 in FIG. 2.

As illustrated in FIG. 5, the conductive layer 4 for example completely covers the planarization layer 3 formed in the Step S120, and is connected with the drain electrode 272 through a second through-hole which is formed by passing through the planarization layer 3.

In the Step S140, the conductive layer is etched to form a pattern of the conductive layer.

Figure 6:
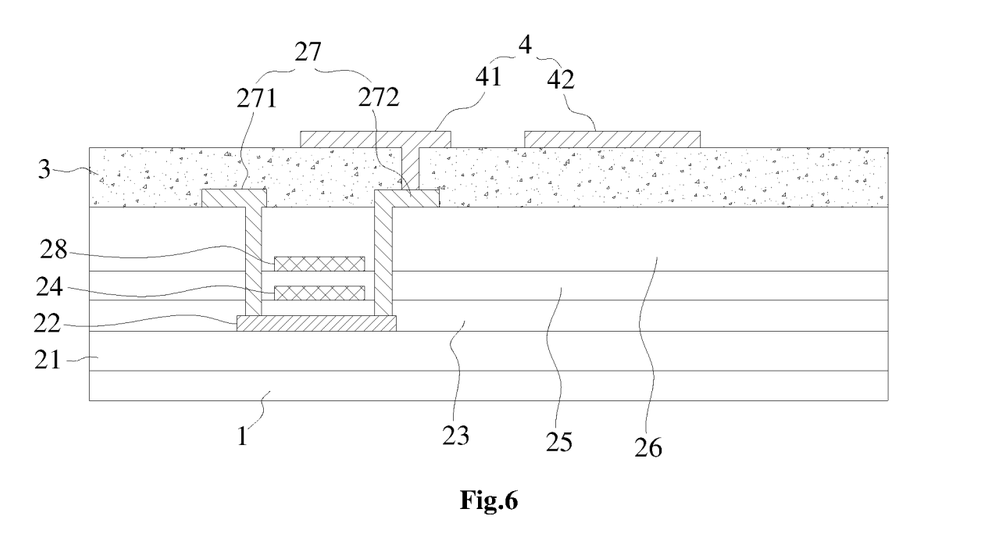
FIG. 6 is a structural schematic view after completing step S140 in FIG. 2.

As illustrated in FIG. 6, for example, the conductive layer 4 is etched by a physical or chemical etching process to form a pattern of the conductive layer 4. By etching the conductive layer 4, for example, the conductive layer is formed into a plurality of groups of electrodes, and each group of the plurality of groups of electrodes for example comprises two electrodes spaced apart from each other at an interval, i.e. a first electrode 41 and a second electrode 42, and the first electrode 41 and the second electrode 42 are for example spaced apart from each other by a groove which is concave and penetrates through the conductive layer 4 and in turn extends into a portion of a thickness of the planarization layer; the plurality of groups of electrodes covers the planarization layer while the planarization layer is exposed from a region outside the plurality of groups of electrodes (i.e., the groove in the planarization layer is exposed from a region outside the plurality of groups of electrodes).

In the Step S150, a region of the planarization layer not covered by the conductive layer is etched, so as to form at least one projection portion and at least one base portion, the conductive layer being located on respective surface of each projection portion facing away from the driving device layer.

As illustrated in FIG. 7, for example, a dry etching is used to etch the region of the planarization layer 3 not covered by the conductive layer 4. For example, a gas comprising oxygen is used in the etching and specific compositions thereof may depend on specific process conditions, without any special restriction being made here. An etching depth is for example 3000 Å~5000 Å, wherein 1 Å is equal to 0.1 nm. Of course, the planarization layer 3 is also etched by other means, for example. The region of the planarization layer not covered by the conductive layer is formed as the at least one base portion, and a region of the planarization layer covered by the conductive layer is formed as the at least one projection portion.

In the Step S160, a spacer layer is formed on a surface of the conductive layer facing away from the planarization layer.

As illustrated in FIG. 8, a method for forming a spacer layer 5 may for example refer to the planarization layer 3, and a specific structure of the spacer layer 5 may for example refers to the spacer layer 5 in the implementation of the drive backplane, which will not be described in detail here. In other words, the spacer layer 5 is for example provided on the surface of the conductive layer 4 facing away from the planarization layer 3, and does not completely cover the plurality of groups of electrodes. And since the spacer layer 5 for example extends at least partially into the planarization layer as illustrated (for example, extending into the groove which is concave and formed between two adjacent projection portions 301, the spacer layer 5 for example spaces first electrode 41 apart from the second electrode 42 in the respective group of the plurality of groups of electrodes, for example).

In the Step S170, a binding layer is formed on a surface of the spacer layer facing away from the conductive layer (comprising an inclined side surface and a flat upper surface), and a surface of the conductive layer 4 facing away from the planarization layer 3, the binding layer being connected with the conductive layer and being a location on which a light-emitting device is to be provided.

For example, the binding layer 6 is formed on the surface of the spacer layer 5 facing away from the conductive layer 4 for example by lithography, printing or one or more other processes, and the binding layer 6 for example extends to a region of the conductive layer 4 which is not covered by the spacer layer 5, so as to connect with the conductive layer 4.

In the Step S180, a black matrix is formed in the at least one base portion, the at least one projection portion protruding above the black matrix.

As illustrated in FIG. 1, a structure of the black matrix 7 may for example refer to the black matrix 7 in the implementations of the drive backplane, which will not be described in detail here.

The method according to the embodiments of the present disclosure for example also comprises:

Step S190, forming an insulation layer in the at least one base portion, the insulation layer extending towards the conductive layer and covering a portion of a region of the conductive layer.

As illustrated in FIG. 1, the black matrix 7 is for example provided on a surface of the insulation layer 8 facing away from the planarization layer 3, and the binding layer 6 for example covers a region of the insulation layer 8 corresponding to the conductive layer 4.

Figure 9:
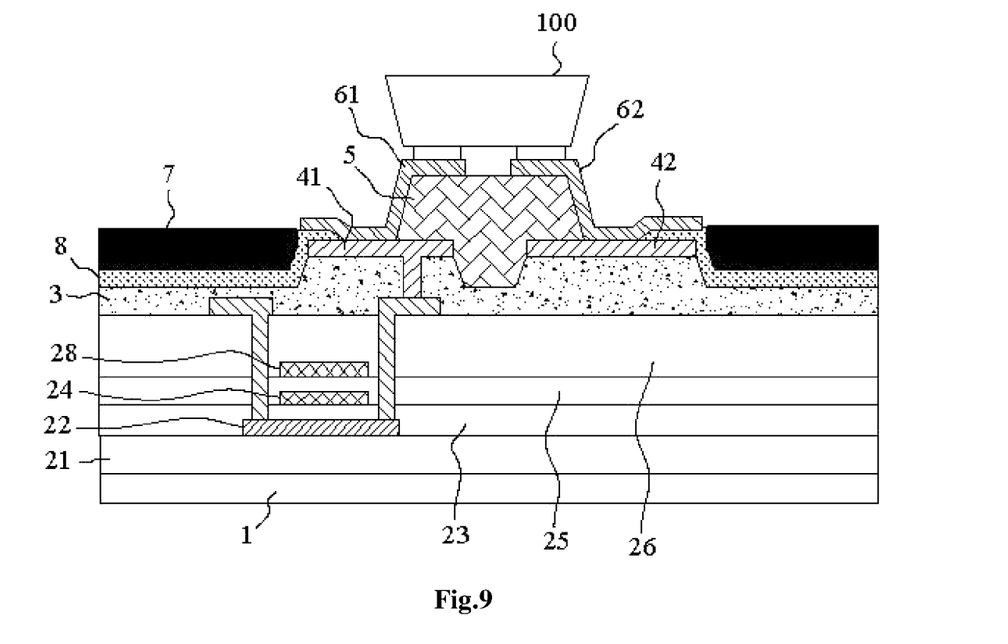
FIG. 9 is a structural schematic view of a display panel according to embodiments of the present disclosure.

In embodiment of the disclosure, a display panel is provided, as illustrated in FIG. 9, which for example comprises at least one light-emitting device 100 and the drive backplane in above embodiments, specifically:

Specific structure of the drive backplane may for example refer to the embodiments of the drive backplane as described above, and will not be described in detail here.

For example, the at least one light-emitting device 100 is provided on a surface of the binding layer 6 facing away from the conductive layer 4, for example, a specific number of the light-emitting devices 100 is for example a plurality of (i.e., multiple) light-emitting devices, and are provided in one-to-one correspondence on a plurality of bonding pads of the binding layer 6; at the same time, various light-emitting device 100 are connected in one-to-one correspondence with a plurality of driving devices of the driving device layer 2 by the plurality of bonding pads, so as to independently and individually control emission of light, for example, to display an image.

In the embodiment of the present disclosure, an electronic apparatus is also provided, for example comprising, the display panel according to above embodiments. The electronic apparatus may for example be one of following: such as mobile phone, tablet computer, electronic watch and any other device having a display panels, which will not be listed one by one here.

As compared with relevant art, on the basis of above technical solutions, the drive backplane, the display panel, the electronic apparatus, and the method for preparing a drive backplane according to embodiments of the disclosure at least have beneficial effects as follows:

As to the drive backplane, the display panel, the electronic apparatus, and the method for preparing a drive backplane according to the embodiments of the present disclosure, since the planarization layer has at least one projection portion and at least one base portion, the black matrix is located at the at least one base portion, and the binding layer is located at the at least one projection portion and is further raised by both the spacer layer and the conductive layer, thereby increasing the height of the binding layer such that the binding layer protrudes over the black matrix, facilitating connecting a light-emitting device layer with the binding layer; at the same time, by adopting the at least one base portion, a local thickness of the planarization layer may be reduced, so as to reduce the amount of gas storage, facilitating reduction in gas displacement of the planarization layer and ensuring the product quality.

After considering the specification and practicing the embodiments of the disclosure as disclosed herein, it may easily occur to those skilled in the art some other embodiments of the present disclosure. The embodiments of the disclosure are intended to cover any variation, usage or adaptive modification of the disclosure, all of which follow the general principles of the embodiments of the disclosure and comprise common general knowledge or frequently used technical means in the technical field not disclosed in the disclosure. The specification and the embodiments are merely regarded as exemplary, and a true scope and spirit of the present disclosure are indicated by the appended claims.

What is claimed is:

1. A drive backplane, comprising:
   a base substrate;
   a driving device layer on the base substrate, comprising an electrode layer;
   a planarization layer, on a surface of the driving device layer facing away from the base substrate, and the planarization layer being provided with at least one projection portion and at least one base portion adjacent to the at least one projection portion both on a surface of the planarization layer facing away from the driving device layer, each projection portion having a greater thickness than that of each base portion in a direction perpendicular to a plane in which the base substrate is located;
   a conductive layer, on respective surface of each projection portion facing away from the driving device layer, the conductive layer being connected with the electrode layer of the driving device layer;
   a spacer layer, on a surface of the conductive layer facing away from the planarization layer, the spacer layer at least partially covering the surface of the conductive layer facing away from the planarization layer; and
   a binding layer, at least partially covering both a surface of the spacer layer facing away from the conductive layer and a portion of the surface of the conductive layer facing away from the planarization layer which is not covered by the spacer layer, the binding layer being where a light-emitting device is to be provided.

2. The drive backplane according to claim 1, wherein the drive backplane further comprises a black matrix provided at the at least one base portion, with the at least one projection portion being not covered by the black matrix.

3. The drive backplane according to claim 2, wherein a height of the spacer layer protruding above the black matrix is not less than 1 µm.

4. The drive backplane according to claim 2, wherein the drive backplane further comprises an insulation layer on the surface of the at least one base portion facing away from the base substrate, the insulation layer extending to the conductive layer and covering a portion of a region of the conductive layer, with the black matrix being provided on a surface of the insulation layer facing away from the planarization layer.

5. The drive backplane according to claim 4, wherein the binding layer covers a region of the insulation layer overlapping with the conductive layer.

6. The drive backplane according to claim 2, wherein a distance between the conductive layer and bottoms of the at least one base portion is the same as a thickness of the black matrix.

7. The drive backplane according to claim 2, wherein the at least one projection portion comprises a plurality of projection portions, and the at least one base portion comprises a plurality of base portions;
   the conductive layer comprises a plurality of groups of electrodes provided in one-to-one correspondence on respective surfaces of the plurality of projection portions facing away from the driving device layer, and each group of the plurality of groups of electrodes comprises a first electrode and a second electrode, and the first electrode is connected with a drain electrode through a through-hole;
   the spacer layer comprises a plurality of spacer portions provided in one-to-one correspondence on respective surfaces of the plurality of groups of electrodes facing away from the planarization layer, and each of the plurality of spacer portions spaces respective first electrode apart from respective second electrode;
   the binding layer comprises a plurality of bonding pads provided in one-to-one correspondence on respective surfaces of the plurality of spacer portions facing away from the planarization layer, and each of the plurality of bonding pads is connected with respective first electrode and respective second electrode; and
   the black matrix comprises a plurality of light-shielding units provided in one-to-one correspondence in the plurality of base portions.

8. The driving backplane according to claim 7, wherein an orthogonal projection of each group of electrodes on the driving device layer and an orthogonal projection of a respective one of the plurality of projection portions on the driving device layer at least partially overlap with each other; or
   an orthogonal projection of each of the plurality of spacer portions on the driving device layer and an orthogonal projection of a respective group of the plurality of groups of electrodes on the driving device layer at least partially overlap with each other; or
   an orthogonal projection of each of the plurality of light-shielding units on the driving device layer and an orthogonal projection of a respective one of the base portions on the driving device layer at least partially overlap with each other.

9. The driving backplane according to claim 1, wherein the spacer layer at least partially covers the surface of the conductive layer facing away from the planarization layer, and extends to a groove formed between adjacent ones of the at least one projection portion of the planarization layer.

10. The drive backplane according to claim 1, wherein the driving device layer further comprises:
    a buffer layer, on the base substrate;
    an active layer, on a surface of the buffer layer facing away from the base substrate;
    a first gate insulation layer covering both the active layer and a region of the buffer layer which is not covered by the active layer;
    a gate electrode, on a surface of the first gate insulation layer facing away from the active layer;
    a second gate insulation layer covering both the gate electrode and a region of the first gate insulation layer which is not covered by the gate electrode; and
    an interlayer medium layer, on a surface of the second gate insulation layer facing away from the gate electrode;
    wherein the electrode layer is provided on a surface of the interlayer medium layer facing away from the second gate insulation layer, and comprises a source electrode and a drain electrode, both the source electrode and the drain electrode are respectively connected with the active layer through respective first through-holes, and the respective first through-holes extend through the interlayer medium layer, the second gate insulation layer and the first gate insulation layer and in turn reach a surface of the active layer facing away from the base substrate.

11. The drive backplane according to claim 10, wherein the driving device layer comprises a capacitive electrode on the surface of the second gate insulation layer facing away from the gate electrode, and an orthogonal projection of the capacitive electrode on the first gate insulation layer coincides with an orthogonal projection of the gate electrode on the first gate insulation layer, and the interlayer medium layer covers both the capacitive electrode and a region of the second gate insulation layer which is not covered by the capacitive electrode, and the capacitive electrode and the gate electrode collectively form a storage capacitance.

12. A method for preparing a driving backplane, comprising:
forming a driving device layer on a base substrate;
forming a planarization layer on a surface of the driving device layer facing away from the base substrate;
forming a conductive layer on a surface of the planarization layer facing away from the driving device layer, the conductive layer being connected with an electrode layer in the driving device layer;
forming a pattern of the conductive layer by etching the conductive layer;
forming at least one projection portion and at least one base portion by etching a region of the planarization layer not covered by the conductive layer, the conductive layer being located on respective surface of each projection portion facing away from the driving device layer;
forming a spacer layer on a surface of the conductive layer facing away from the planarization layer, the spacer layer being formed to extend into a portion of a thickness of the planarization layer; and
forming a binding layer on a surface of the spacer layer facing away from the conductive layer, the binding layer being connected with the conductive layer and being where a light-emitting device is to be provided.

13. The method according to claim 12, wherein, after "forming a binding layer on a surface of the spacer layer facing away from the conductive layer", the method further comprises:
forming a black matrix in the at least one base portion, the at least one projection portion protruding above the black matrix.

14. The method according to claim 12, wherein "forming a driving device layer on a base substrate" comprises:
forming a buffer layer on the base substrate;
forming an active layer on a surface of the buffer layer facing away from the base substrate;
forming a first gate insulation layer covering both the active layer and a region of the buffer layer which is not covered by the active layer;
forming a gate electrode on a surface of the first gate insulation layer facing away from the buffer layer, an orthogonal projection of the gate electrode on the buffer layer being covered by the active layer;
forming a second gate insulation layer covering both the gate electrode and a region of the first gate insulation layer which is not covered by the gate electrode;
forming an interlayer medium layer on a surface of the second gate insulation layer facing away from the gate electrode;
forming first through-holes penetrating through the first gate insulation layer, the second gate insulation layer and the interlayer medium layer to reach an upper surface of the active layer facing away from the base substrate and to expose the active layer; and
forming a source electrode and a drain electrode on a surface of the interlayer medium layer facing away from the second gate insulation layer, both the source electrode and the drain electrode being connected with the active layer through respective ones of the first through-holes.

15. The method according to claim 14, wherein, after "forming a gate electrode on a surface of the first gate insulation layer facing away from the buffer layer", and before "forming a second gate insulation layer covering both the gate electrode and a region of the first gate insulation layer which is not covered by the gate electrode", in the method, "forming a driving device layer on a base substrate" further comprises:
forming a capacitive electrode on the surface of the second gate insulation layer facing away from the gate electrode, with an orthogonal projection of the capacitive electrode on the first gate insulation layer coinciding with an orthogonal projection of the gate electrode on the first gate insulation layer, and the capacitive electrode and the gate electrode in turn collectively forming a storage capacitance.

16. The method according to claim 12, wherein "forming a pattern of the conductive layer by etching the conductive layer" comprises:
forming a plurality of groups of electrodes by etching the conductive layer, each group of the plurality of groups of electrodes comprising a first electrode and a second electrode, the first electrode and the second electrode being spaced apart from each other by a groove which is concave and penetrates through the conductive layer and in turn extends into a portion of a thickness of the planarization layer, and the first electrode being connected with the drain electrode through a through-hole, the plurality of groups of electrodes covering the planarization layer while the groove in the planarization layer being exposed from a region outside the plurality of groups of electrodes.

17. The method according to claim 12, wherein "forming a binding layer on a surface of the spacer layer facing away from the conductive layer, the binding layer being connected with the conductive layer and being where a light-emitting device is to be provided" comprises:
forming a binding layer on a surface of the spacer layer facing away from the conductive layer by lithography and printing, the binding layer extending to a region of the conductive layer which is not covered by the spacer layer and in turn to be connected with the conductive layer.

18. The method according to claim 12, further comprising:
forming an insulation layer in the at least one base portion, the insulation layer extending towards the conductive layer and covering a portion of a region of the conductive layer.

19. A display panel, comprising:
the drive backplane according to claim 1; and
the light-emitting device provided on the binding layer.

20. An electronic apparatus, comprising the display panel according to claim 19.

* * * * *